(12) United States Patent
Kobayashi et al.

(10) Patent No.: US 6,336,266 B1
(45) Date of Patent: Jan. 8, 2002

(54) ELECTRONIC PARTS INSERTION HEAD AND ELECTRONIC PARTS INSERTION DEVICE

(75) Inventors: Masayoshi Kobayashi; Atsushi Shindo, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/527,238

(22) Filed: Mar. 16, 2000

(30) Foreign Application Priority Data

Mar. 17, 1999 (JP) .......................................... 11-071910
Feb. 24, 2000 (JP) .......................................... 12-047147

(51) Int. Cl.⁷ ................................................ H05K 3/30
(52) U.S. Cl. .......................... 29/741; 29/564.6; 29/832; 29/834; 29/837
(58) Field of Search .......................... 29/741, 740, 743, 29/832, 834, 837, 840, 759, 564.6, 564.1, 718; 294/2, 64.2

(56) References Cited

U.S. PATENT DOCUMENTS

| 2,869,130 | A | | 1/1959 | Newton et al. | |
| 3,516,141 | A | | 6/1970 | Rech | |
| 4,054,988 | A | | 10/1977 | Masuzima et al. | |
| 4,196,513 | A | | 4/1980 | Harigane et al. | |
| 4,203,583 | A | | 5/1980 | Zemek et al. | |
| 4,218,817 | A | * | 8/1980 | Takano ......................... | 29/741 |
| 4,245,385 | A | | 1/1981 | Zemek et al. | |
| 4,293,999 | A | * | 10/1981 | Woodman, Jr. ............. | 29/564.6 |
| 4,294,000 | A | | 10/1981 | Takahashi et al. | |
| 4,320,574 | A | | 3/1982 | Harigane et al. | |
| 4,343,589 | A | | 8/1982 | Snyder et al. | |
| 4,356,949 | A | | 11/1982 | Snyder et al. | |
| 4,372,802 | A | * | 2/1983 | Harigane et al. ............ | 156/538 |
| 4,398,658 | A | | 8/1983 | Snyder et al. | |
| 4,403,390 | A | | 9/1983 | Woodman, Jr. | |
| 4,403,723 | A | | 9/1983 | Dean et al. | |
| 4,403,726 | A | | 9/1983 | Snyder et al. | |
| 4,464,833 | A | * | 8/1984 | Duncan ........................ | 29/718 |
| 4,507,862 | A | | 4/1985 | Kukowski et al. | |
| 4,569,550 | A | | 2/1986 | Harigane et al. | |
| 5,784,778 | A | * | 7/1998 | Yoshida et al. ............. | 29/834 |
| 5,832,597 | A | * | 11/1998 | Yokoyama et al. ......... | 29/837 |
| 5,850,683 | A | * | 12/1998 | Okazaki et al. ............. | 29/740 |

FOREIGN PATENT DOCUMENTS

| EP | 0 090 050 | 10/1983 |
| GB | 1 576 365 | 10/1980 |
| JP | 55-51358 | 12/1980 |
| JP | 01 065900 | 3/1989 |
| JP | 3-33114 | 7/1991 |
| JP | 6-51037 | 12/1994 |
| JP | 7-58839 | 6/1995 |

* cited by examiner

*Primary Examiner*—Lee Young
*Assistant Examiner*—Minh Trinh
(74) *Attorney, Agent, or Firm*—Oblon, Spivak, McClelland, Maier & Neustadt, P.C.

(57) ABSTRACT

An electronic parts insertion head including a supporting block, an insertion guide movable between first and second positions with respect to the supporting block and configured to guide a lead wire of an electronic part to an attaching hole of a printed wiring board in the first position, an insertion guide moving mechanism configured to move the insertion guide between the first and second positions, a cam capable of moving with respect to the supporting block, a cam follower arranged on the insertion guide and positioned to move along a cam face of the cam, and a cam position changing mechanism configured to change a position of the cam with respect to the support block, wherein the insertion guide changes a movement locus when the position of the cam is changed by the cam position changing mechanisms.

10 Claims, 8 Drawing Sheets

ELECTRONIC PARTS INSERTION HEAD AND ELECTRONIC PARTS INSERTION DEVICE

BACKGROUND OF THE INVENTION

1. Field of the Invention

The present invention relates to a device for mounting an electronic part with a lead wire to a printed wiring board, and particularly relates to an electronic parts insertion head for automatically inserting the electronic part into an attaching hole of the printed wiring board.

2. Related Background Art

An insertion guide mechanism of electronic parts is proposed in Japanese Utility Model Registration No. 3-33114, etc. In this insertion guide mechanism, a lead wire of an electronic part is inserted into an attaching hole of a printed wiring board by pushing down a top portion of the electronic part by a pushing rod from above while the lead wire of the electronic part is nipped and guided by an insertion guide.

In such an electronic parts insertion mechanism, the above insertion guide guides the lead wire of the electronic parts in a guide position near the attaching hole of the printed wiring board. When the insertion of one electronic part is completed, the insertion guide is raised to a receiving position higher than the guide position so as to receive the next electronic part. An electronic parts insertion head adopted in the conventional electronic parts insertion mechanism is constructed such that a lower end of the insertion guide is returned to the raised position drawing a constant locus in a returning operation to the raised position of the insertion guide after each electronic part is inserted into the printed wiring board. Therefore, in an insertion guide suitable for the insertion of relatively thin electronic parts such as a ceramic capacitor, when electronic parts of a large diameter such as an electrolytic capacitor are inserted, the electronic parts of a large diameter become a hindrance in the returning operation of the insertion guide after the insertion. Therefore, the insertion guide and the electronic parts interfere with each other so that returning operation cannot be performed. On the other hand, when relatively thin electronic parts such as a ceramic capacitor are inserted by the insertion guide suitable for the insertion of large electronic parts such as an electrolytic capacitor, a runout in the returning operation of the insertion guide after the insertion is unnecessarily large. Therefore, mounting density in attachment of the electronic parts to the printed wiring board cannot be increased.

An electronic parts insertion head as a measure for solving such a problem is proposed in Japanese Patent Publication No. 7-58839. In this electronic parts insertion head, a locus of the rising insertion guide can be changed by changing a position of the fulcrum shaft of a link for supporting the insertion guide. In an example of this construction, the fulcrum shaft of the link is moved by using a piston driven by the air so that the position of the link fulcrum shaft with respect to a supporting block is changed. The position of the fulcrum shaft is moved between predetermined first and second positions and two loci of the rising insertion guide can be switched in accordance with these positions.

In the electronic parts insertion head as disclosed in the above Japanese Patent Publication No. 7-58839, the loci for the rising insertion guide, in which the insertion guide runs away from the electronic parts inserted into the attaching hole of the printed wiring board, are switched by changing the position of the fulcrum shaft of the link for supporting the insertion guide with respect to the supporting block from the first position to the second position. In the example of Japanese Patent Publication No. 7-58839, the fulcrum shaft is moved by the piston driven by the air in the switching of the above rising loci. When the insertion head is in the lowered position, it is necessary to locate the insertion guide at a predetermined position so as to insert the lead wire of the electronic part into the attaching hole of the printed wiring board. On the other hand, when the insertion head is in the raised position, it is also necessary to locate the insertion guide in a predetermined position so as to receive the lead wire of the electronic part supplied from a parts supplying system. Accordingly, when the predetermined position of the insertion guide in the reception of the electronic parts corresponds to, for example, the first position of the above fulcrum shaft of the link and the locus corresponding to the second position of the fulcrum shaft is selected, the position of the fulcrum shaft must be changed to the first position by supplying the air every time the insertion head is raised. Namely, a switching operation of the locus is required every time the insertion head is raised and lowered.

SUMMARY OF THE INVENTION

An object of the present invention is to increase stability, efficiency and speed of the operation of an electronic parts insertion head such that no switching operation is performed when the same state of a rising locus is continued. The other objects will be described in the explanation of embodiments.

To solve the above problems, an electronic parts insertion head in the present invention comprises:

a supporting block;

an insertion guide movable between first and second positions with respect to the supporting block and guiding a lead wire of an electronic part to an attaching hole of a printed wiring board in the first position;

an insertion guide moving mechanism for moving the insertion guide between the first and second positions;

a cam capable of changing its position with respect to the supporting block; and a cam follower arranged on the insertion guide and moved along a cam face of the cam while being in contact with the cam face during the movement of the insertion guide between the first and second positions; and a cam position changing mechanism for changing the position of the cam, in which a locus of the movement of the insertion guide can be changed by changing the position of the cam by the cam position changing mechanism.

In the normal construction of the device, the printed wiring board is arranged below the electronic parts insertion head. Accordingly, the above first position becomes a lowered position lower than the above second position and the second position becomes a raised position.

In one constructional example of the above electronic parts insertion head, the insertion guide further has a biasing means connected to the supporting block by an arm having one end pivotally supported by the supporting block and the other end pivotally supported by the insertion guide, the biasing means constantly biasing the insertion guide to make the cam follower of the insertion guide come in contact with the cam face so that the moving locus of the insertion guide is determined by constraint due to the arm and the contact of the following portion and the cam face.

In the above electronic parts insertion head, the cam position is preferably changed by the cam position changing means with pneumatic pressure as a driving source.

When this electronic parts insertion head is embodied, it is preferable to arrange an electric parts pressing mechanism for pressing the electronic part to insert the lead wire thereof into the attaching hole of the printed wiring board to a desired depth by applying force to the electronic parts.

An important feature the above electronic parts insertion head of the present invention is that the cam face (or a shape of the cam face) coming in contact with the cam following portion during the movement of the insertion guide can be changed so that the locus of the movement of the insertion guide can be changed. It should be understood that the cam face coming in contact with the cam follower during the movement of the insertion guide can be changed by other ways that are different from changing the position of the single cam. Namely, the cam face coming in contact with the cam follower during the movement of the insertion guide may also be changed by, for example, arranging plural cams and switching these cams. In this case, the electronic parts insertion head is defined as follows.

The electronic parts insertion head comprises:

a supporting block;

an insertion guide movable between first and second positions with respect to the supporting block and guiding a lead wire of an electronic part to an attaching hole of a printed wiring board in the first position;

insertion guide moving means for moving the insertion guide between the first and second positions; and a cam mechanism including cam means and a cam follower that is arranged on the insertion guide and adapted to move along a cam face of the cam means while being in contact with the cam face when the insertion guide is moving between the first and second positions, in which the cam face coming in contact with the cam follower at a moving time of the insertion guide can be changed in the cam mechanism so that a locus of the movement of the insertion guide can be changed.

However, it is preferable to use the above construction in which the cam means of the cam mechanism is constructed by a single cam, and the cam position changing mechanism for changing the position of the cam with respect to the above supporting block is arranged, and the cam face coming in contact with the cam following portion at the moving time of the insertion guide is changed by changing the position of the cam. This is because the number of cams is one, and the shape of the cam face coming in contact with the cam following portion can be simply changed by switching the position of the cam. Accordingly, this construction is simple and preferable in comparison with a construction for switching plural cams.

The present invention also provides an electronic parts insertion device comprising: a parts supplying mechanism for supplying an electronic part having a lead wire; an electronic parts insertion head for receiving the electronic part from the parts supplying mechanism and inserting the lead wire of the electronic part into an attaching hole of a printed wiring board; and a clinch mechanism for cutting, bending and fixing the lead wire of the electronic part inserted into the printed wiring board, in which the electronic parts insertion head comprises:

a base;

an insertion guide movable between first and second positions with respect to the base and guiding the lead wire of the electronic part to a position of the attaching hole of the printed wiring board in the first position;

insertion guide moving means for moving the insertion guide between the first and second positions;

a cam capable of changing its position with respect to a body of the electronic parts insertion head;

a cam follower arranged on the insertion guide and moved along a cam face of the cam while being in contact with the cam face during the movement of the insertion guide between the first and second positions; and a cam position changing mechanism for changing the position of the cam, and is characterized in that a locus of the movement the insertion guide can be changed by changing the position of the cam by the cam position changing mechanism.

In one constructional example of the above electronic parts insertion device, the insertion guide further has biasing means connected to the base by an arm having one end pivotally supported by the base and the other end pivotally supported by the insertion guide, the biasing means constantly biasing the insertion guide such that the cam follower of the insertion guide comes in contact with the cam face, and the locus of the movement of the insertion guide is determined by constraint due to the arm and by the contact between the following portion and the cam face.

In the above electronic parts insertion device, the cam position is preferably changed by the cam position changing mechanism with pneumatic pressure as a driving source.

When this electronic parts insertion device is embodied, an electric parts pressing means for pressing the electronic part to insert the lead wire thereof into the attaching hole of the printed wiring board to a desired depth by applying force to the electronic part is normally preferably arranged in the electronic parts insertion head.

In the electronic parts insertion head or the electronic parts insertion device of the present invention explained above, the movement locus of the insertion guide in the movement from the first position to the second position (namely, at a rising time of the insertion guide) can be changed by merely changing the position of the cam. Namely, a rising and retreating locus of the insertion guide can be changed in accordance with thicknesses and diameters of the electronic parts. Then, various loci can be formed by merely changing the cam face of the above cam and a cam curved surface. Accordingly, a very flexible construction, i.e., a construction having a high degree of freedom in setting of the locus is obtained in comparison with a case in which the locus is determined by design of the insertion head.

Further, it is not necessary to return the insertion guide in a position in which the insertion guide receives the electronic part from a delivery chuck. When electronic part of the same kind in thickness and diameter continue, operation for changing the locus of the insertion head need not be performed every time so that the more stable operation is performed at a high speed. Further, an operating time for changing the locus is sufficiently allocated in comparison with a conventional case. Further, the electronic parts of from a small diameter to a large diameter can be automatically inserted by a selection using a program set in advance without exchanging the insertion guide, etc.

DESCRIPTION OF THE PREFERRED EMBODIMENT

An embodiment of an electronic parts insertion head and an electronic parts insertion device having the electronic parts insertion head according to the present invention will next be explained with reference to the drawings.

Figure 8:
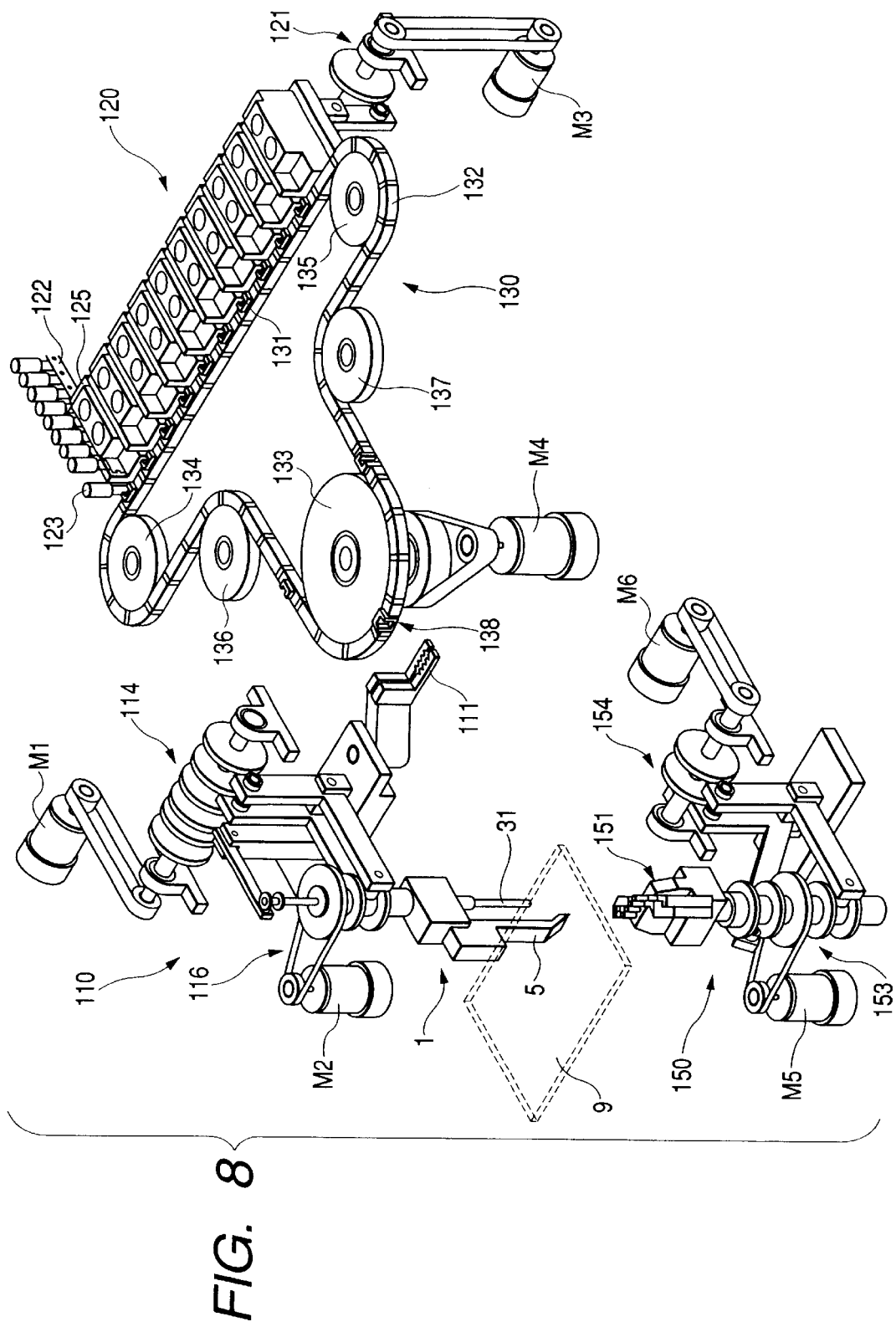
FIG. 8 is a perspective view schematically showing an electronic parts insertion device.

FIG. 8 is a perspective view graphically showing in a simplified manner an entire construction of an example of the electronic parts insertion device for inserting an electronic part with lead wires into an attaching hole of a printed wiring board, and cutting, bending and fixing the lead wires. The electronic parts insertion device has a parts supplying section 120, a parts conveying section 130, an insertion head section 110, a clinch section and a not-shown XY table. The parts supplying section 120 sequentially supplies electronic parts with lead wires in accordance with a predetermined insertion order. The parts conveying section 130 sequentially conveys the electronic parts supplied from the parts supplying section 120. The insertion head section 110 receives the electronic parts from the parts conveying section 130 and inserts the electronic parts into the attaching holes of a printed wiring board 9. The clinch section cuts, bends and fixes the lead wires of the electronic parts with the lead wire inserted into the printed wiring board 9. The XY table supports the printed wiring board 9 in such a manner that the printed wiring board 9 is freely moved horizontally.

The parts supplying section 120 has plural tape feeders 125 arranged at a predetermined interval. A tape 122 having an electronic part 123 with lead wires pulled out of a not-shown reel winding a series of electronic parts with lead wires therearound is set in each tape feeder. (For brevity, only a tape set in a deepest tape feeder is drawn in FIG. 8.) Each tape feeder is operated by a driving system 121 having a motor M3 and sends out the electronic part 123 in predetermined timing. Each tape feeder then cuts the lead wires of the electronic part 123 and separates the lead wires from the tape 122 and supplies the electronic parts to a pallet 131 of the parts conveying section 130.

The parts conveying section 130 has a chain 132 stretched between sprockets 133, 134, 135 and many pallets 131 are fixed onto this chain 132 at a predetermined interval. Idler rollers 136, 137 are arranged between the sprockets. A motor M4 is connected to one sprocket 133 by a belt and drives the chain 132. The parts conveying section 130 conveys the electronic parts supplied from the parts supplying section 120 to a portion near the insertion head section 110.

The insertion head section 110 has a delivery head 111 having a chuck for nipping the electronic parts. The delivery head 111 has a function for opening and closing the chuck and a function for horizontally moving (swinging) the chuck. The delivery head 111 nips the electronic part 123 held by a pallet located at a delivery position 138 to the insertion head section among the pallets 136 on the chain 132 of the parts conveying section 130, and delivers the electronic part 123 from the pallet 136 to the insertion guide 5 of the insertion head 1. The insertion guide 5 nips the lead wires of the electronic part and guides the lead wires to the attaching hole of the printed wiring board. The insertion head 1 has a pushing rod 31 for pushing down a head portion of the electronic parts and inserting the electronic part into the printed wiring board. The insertion head will be described later in detail. The delivery head and the insertion head are driven through mechanisms 114, 116 with motors M1 and M2 as driving sources.

The electronic parts are supplied to the insertion head through the parts supplying section 120, the parts conveying section 130 and the delivery head 111. Accordingly, in this embodiment, a combination of the parts supplying section 120, the parts conveying section 130 and the delivery head 111 corresponds to a parts supplying mechanism mentioned in the above "Summary of the Invention".

A clinch section 150 is arranged below the insertion head section 110 with the printed wiring board 9 between. When the electronic part is inserted into the attaching hole of the printed wiring board 9 by the insertion head 1, a clinch head 151 of the clinch section cuts the lead wires of the electronic part projected below the printed wiring board 9 and bends and fixes the lead wires. The clinch head 151 is driven through members 153, 154 with motors M5 and M6 as driving sources.

An encoder is attached to each of the motors M1 to M6. While rotation of each motor is constantly monitored by the encoder, the rotation of each motor is synchronously controlled by a not-shown control section.

Subsequently, the insertion head 1 will be explained in detail with reference to FIGS. 1 to 7B.

Figure 1:
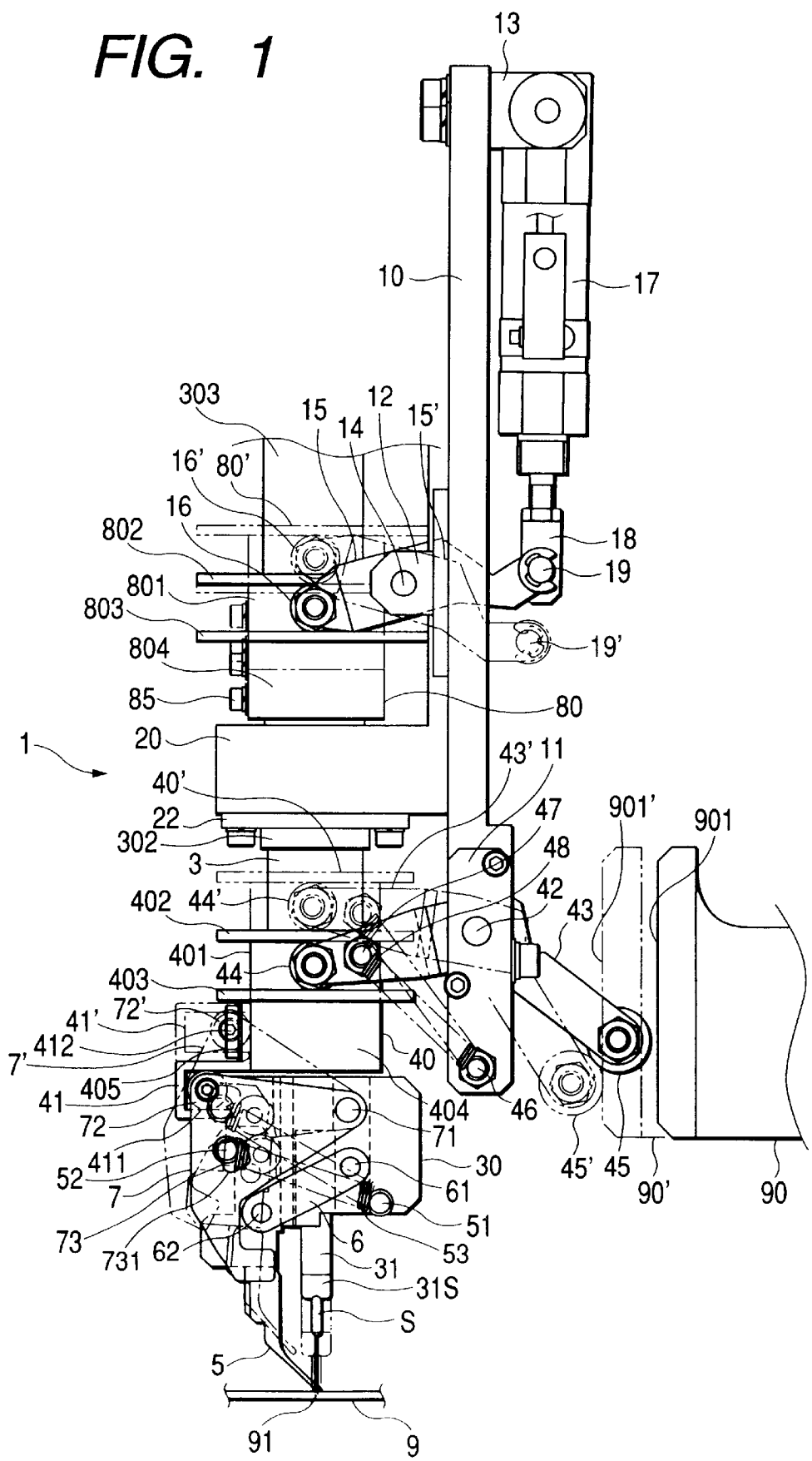
FIG. 1 is a view showing the external appearance of an electronic parts insertion head as an embodiment of the present invention.

FIG. 1 shows an external appearance of the electronic parts insertion head 1 viewed from its side face. The insertion head 1 is integrally constructed by attaching each component to a base plate 10. The base plate 10 is slidably supported in a vertical direction with respect to a body of the insertion device. The base plate 10 constitutes a base as the foundations of the insertion head.

The printed wiring board 9 is located below the insertion head 1 such that a surface of the printed wiring board 9 is perpendicular to the vertical direction of the insertion head 1. The printed wiring board 9 is held by a not-shown XY table arranged in the insertion device body. The XY table is freely moved in a surface direction such that the attaching holes 91 of the printed wiring board 9 are located below the lead wires of each electronic part S, L. In the drawings and the following explanation, the electronic part S represents a relatively compact part and the electronic part L represents a relatively large-sized part.

A bearing base 20 is fixed to the base plate 10. As can be seen from FIGS. 2 and 3 which are side sectional views of the electronic parts insertion head 1, the bearing base 20 has a hole 201 extending in a longitudinal direction. A ball bearing 21 is arranged within this hole 201. The ball bearing 21 is fixed to a lower portion of the hole 201 by a cover 21 fastened to the bearing base 20 by a bolt.

A small diameter portion of a main shaft 3 is fitted and inserted into an inner ring of the ball bearing 21. A level difference 301 is formed in an outer circumference of the main shaft. A cylinder 302 is fitted and inserted between the level difference 301 and the ball bearing 21 and restricts an upward movement of the main shaft 3. A similar bearing base having a ball bearing is arranged above the bearing base 20 although this similar bearing base is omitted in the drawings. A cylinder 303 is fitted and inserted between the ball bearing 21 in a lower portion and the ball bearing fitted and attached to the unillustrated similar bearing base in an upper portion. A not-shown upper portion of the main shaft 3 has a screw portion and a nut for a bearing is screwed into this screw portion and is fastened in an axial direction. Thus, the main shaft 3 is fixed to the ball bearing 21 in the axial direction and is rotatable or pivotable by the ball bearing 21.

As shown in FIG. 1, a lower slider 40 having a bore at its center is mounted around an outside circumferential portion of the main shaft 3 below its level difference 301. (The lower slider 40 is omitted in FIGS. 2 and 3.) The lower slider 40 is slidably moved in the axial direction of the main shaft 3. An upper portion of the lower slider 40 has flanges 402, 403 and a groove 401 between these flanges. A boss 404 having a circular external shape extends below the flange 403. A plane 405 is formed at one outside portion of the boss 404 in a direction perpendicular to a paper face of FIG. 1. A screw hole is formed on the plane 405 and a roller hook 41 is fixedly attached to the plane 405 by a bolt. The roller hook 41 has an extending portion 412 and a concave groove 411 formed by a hook portion having a U-shape. The extending portion 412 is fastened by a bolt in conformity with the plane 405 and is fixedly attached to the lower slider 40.

A plate 11 is fastened and fixed to a lower portion of the base plate 10 by a bolt. An intermediate portion of a lever 43 is pivotally mounted to the plate 11 by a shaft 42. The lever 43 is freely swung on a face parallel to the paper face of FIG. 1 about the shaft 42. A roller 44 is rotatably attached to the left-hand end of the lever 43. A roller 45 is rotatably attached to the right-hand end of the lever 43. A spring peg 46 is fixed to a lowermost portion of the base plate 10. On the other hand, a spring peg 47 is arranged in a left-hand side portion of the lever 43. A tension spring 48 is stretched in a stretch direction of the spring pegs 46 and 47.

The roller 44 is fitted and engaged with the groove 401 of the lower slider 40, i.e., a concave portion between the flanges 402 and 403. Thus, when the lever 43 is swung about the shaft 42, the lower slider 40 is slid by the roller 44 attached onto the lever 43 in the axial direction of the main shaft 3. In this case, the tension spring 48 constantly exerts a tension force in the counterclockwise rotating direction of the lever 43. Accordingly, the lower slider 40 is biased on a lower side of the main shaft 3.

As mentioned above, the roller 45 is rotatably attached to a right-hand end of the lever 43. In FIG. 1, a pusher 90 arranged in the insertion device body is arranged on a right-hand side of the roller 45. The pusher 90 goes in and out in a direction (leftward and rightward directions in FIG. 1) perpendicular to the axial direction of the main shaft 3. A pusher face 901 is located in a position in which the pusher face 901 comes in contact with an outside surface of the roller 45 to push it. As the pusher is moved from a position 90 drawn by a solid line to a position 90' drawn by a dashed line, the lever 43 is swung from a state 43 drawn by a solid line to a state 43 drawn by a dashed line about the shaft 42. When the pusher is separated from the lever 43, the lever 43 is returned to the state 43 drawn by the solid line by the tension spring 48.

As shown in FIGS. 1 to 5, a supporting block 30 is fixed to a lower end of the main shaft 3. Reference numeral 5 designates an insertion guide. The insertion guide 5 has guide holes (505a, 505b, 505c of FIG. 7B explained later) for nipping and holding the lead wires of the electronic part S (or L). The insertion guide 5 guides this lead wires to the attaching holes of the printed wiring board to which the electronic part should be attached.

Figure 6:
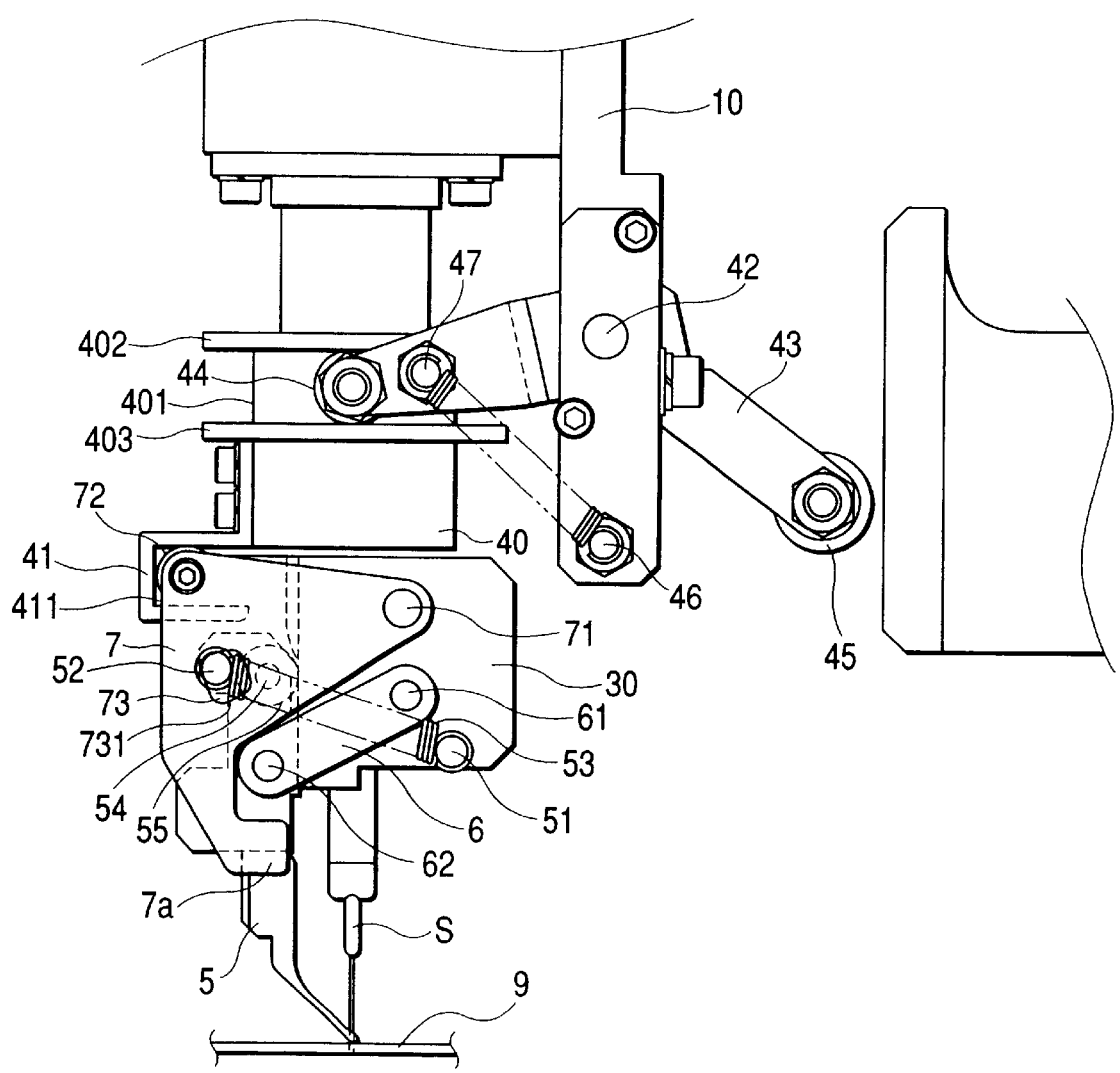
FIG. 6 is an enlarged view of an insertion guide of the electronic parts insertion head and members relating to this insertion guide.

FIG. 6 shows this insertion guide 5 and a main mechanism relating to an operation of this insertion guide 5. Members other than the mechanism relating to the insertion guide are omitted in FIG. 6. As shown best in FIG. 6, the insertion guide 5 is connected to the supporting block 30 through a link mechanism of a first arm 6 and a second arm 7. One end of the first arm 6 is connected to a side of the supporting block 30 so as to be pivotally moved around a pivotal shaft 61. The other end of the first arm 6 is connected to the insertion guide 5 so as to be pivotally moved around a pivotal shaft 62. The second arm 7 is connected to the supporting block 30 so as to be pivotally moved around a pivotal shaft 71. The second arm 7 is not directly connected to the insertion guide 5, and merely a square hole 73 formed in the second arm receives a pin 52 provided on the insertion guide 5.

A roller 72 is rotatably attached to the second arm 7 in a left-hand upper end position of the second arm 7 which is a position dislocated from the insertion guide 5 (namely, a position where it does not overlap with the insertion guide 5). An outer circumference of the roller 72 is fitted into a concave groove 411 of the roller hook 41. The second arm 7 has a square hole 73 approximately formed in a quadrilateral shape. The pin 52 arranged in the insertion guide 5 is projected this side through the hole 73 beyond the second arm 7. Further, a shaft 54 is arranged on the right-hand side of an upper portion of the insertion guide 5 and a roller 55 is rotatably attached to the shaft 54. On the other hand, a pin 51 is arranged on the supporting block 30. A circumferential groove is formed in each of the pins 51 and 52 and to form a spring peg. A tension spring 53 is stretched between the pins 51 and 52. Accordingly, the tension spring 53 biases the pins 51 and 52 constantly in a direction in which the pins 51 and 52 approach each other.

Figure 7A:
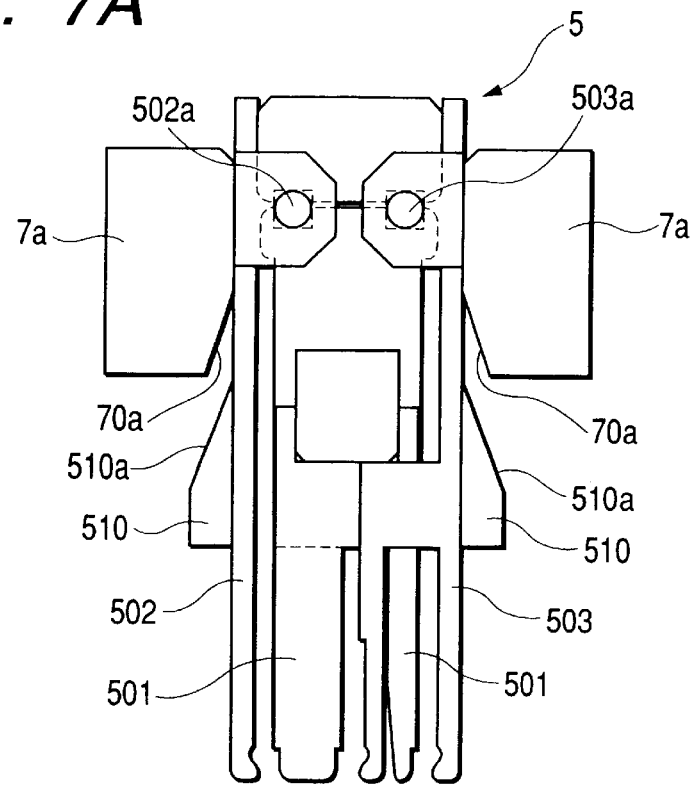
FIG. 7A is a side view of a tip portion of the insertion guide.
Figure 7B:
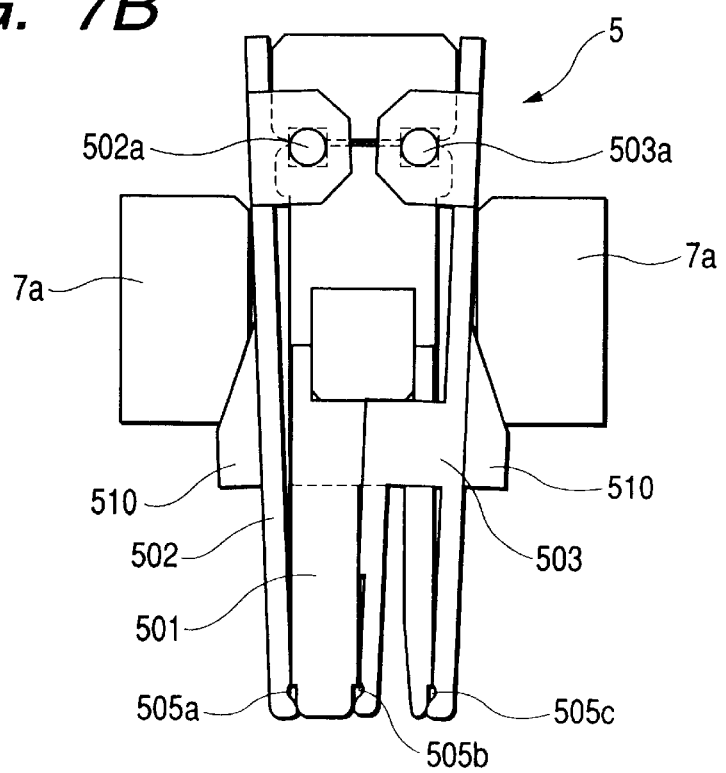
FIG. 7B is a side view of the tip portion of the insertion guide.

A detailed mechanism of the insertion guide 5 will next be explained with reference to FIGS. 7A and 7B. Each of FIGS. 7A and 7B is a view seen from a side face (a rightward direction in FIG. 6) of the insertion guide 5. A tip portion of the insertion guide 5 is constructed by a central fixed member 501 and movable members 502 and 503 on both sides of this fixed member 501. The movable members 502 and 503 can be pivotally moved by slight angles with shafts 502a and 503a as pivots, respectively. In these figures, a tip portion of the right-hand movable member is formed in a fork shape. A projection 510 having on its upper portion a slanting face 510a is attached to each of the movable members 502 and 503 on its outer side.

As can be seen from FIGS. 7A and 7B, the insertion guide 5 is nipped by a lower end portion 7a of the second arm 7 from both sides of this insertion guide 5. The lower end portion 7a of the second arm 7 can be slid with respect to the insertion guide 5 between a position shown in FIG. 7A and a position shown in FIG. 7B. When the end portion 7a of the second arm 7 is slid downward from a state shown in FIG. 7A, an undercut portion 70a of this one end portion 7a rides on the slanting face 510a of the projection 510 and applies force to the movable members 502 and 503 inwardly. Thus, the movable members 502 and 503 are respectively pivotally moved around their shafts and attain a state shown in FIG. 7B. The insertion guide nips and holds, by this operation, the lead wires of the electronic parts in guide holes 505a, 505b, 505c formed in tip portions of the insertion guide shown in FIG. 7B. The one end portion 7a of the second arm is conversely slid upward from the state of FIG. 7B so that the arrangement is returned to the state of FIG. 7A. In this case, the insertion guide releases the holding of the lead wire of the electronic parts in the guide holes 505a, 505b, 505c.

As shown in FIG. 1, a first fulcrum base 12 is fixedly attached to the above base plate 10 and a second fulcrum base 13 is fixed to the base plate 10 by a screw. An intermediate portion of the lever 15 is pivotally supported by a shaft 14 arranged in the first fulcrum base 12 such that the lever 15 is freely swung in a direction parallel to the paper face of FIG. 1 with the shaft 14 as a pivot. A roller 16 is rotatably attached to a left-hand end of the lever 15.

On the other hand, a rear end of an air cylinder 17 is swingably attached to the second fulcrum base 13. A joint 18 is fixed to a piston rod projected from a front end of the air cylinder 17. Holes respectively formed in the joint 18 and the right-hand end of the lever 15 are swingably connected to each other by a shaft 19. A not-shown pneumatic circuit is connected to the air cylinder 17. When the piston rod of the air cylinder 17 goes in and out by supplying the air from the pneumatic circuit, the lever 15 is swung with the shaft 14 as a pivot.

Figure 2:
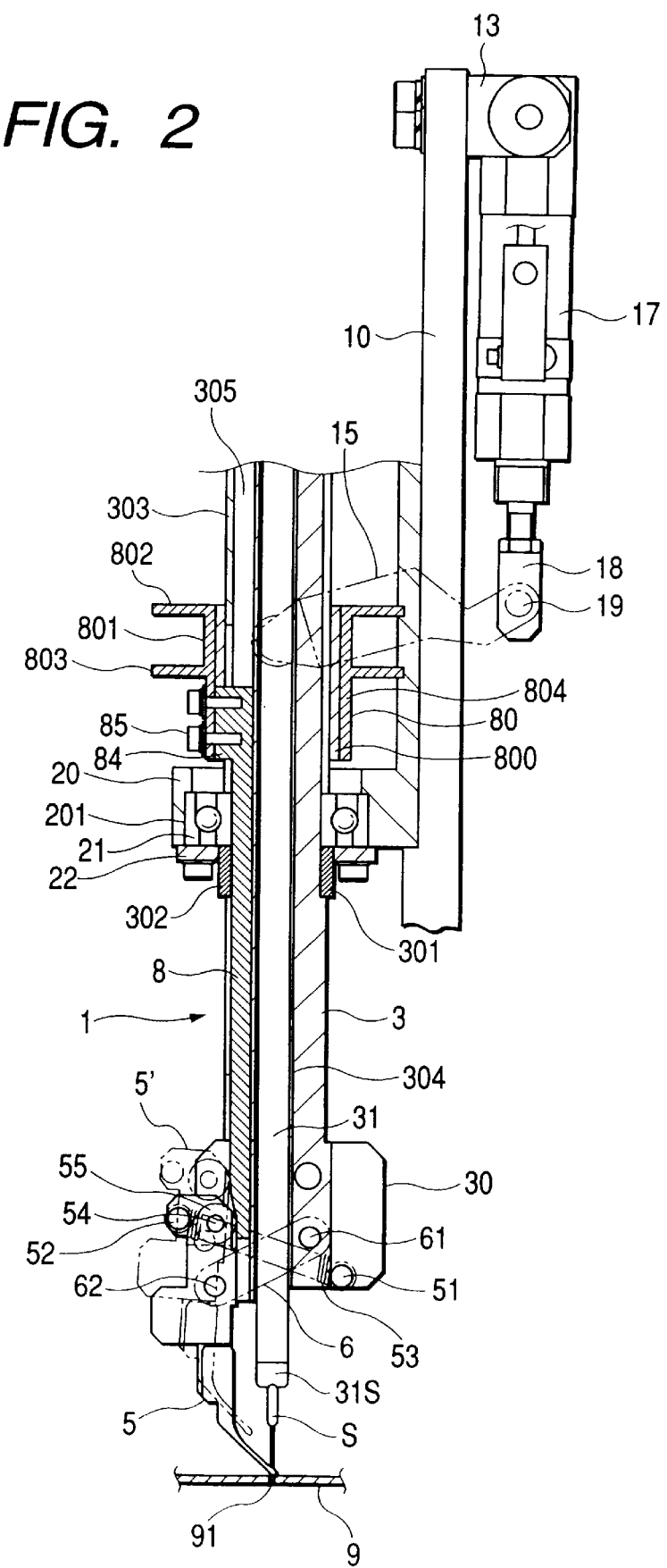
FIG. 2 is a cross-sectional view of the electronic parts insertion head at a time of inserting an electronic part S.
Figure 3:
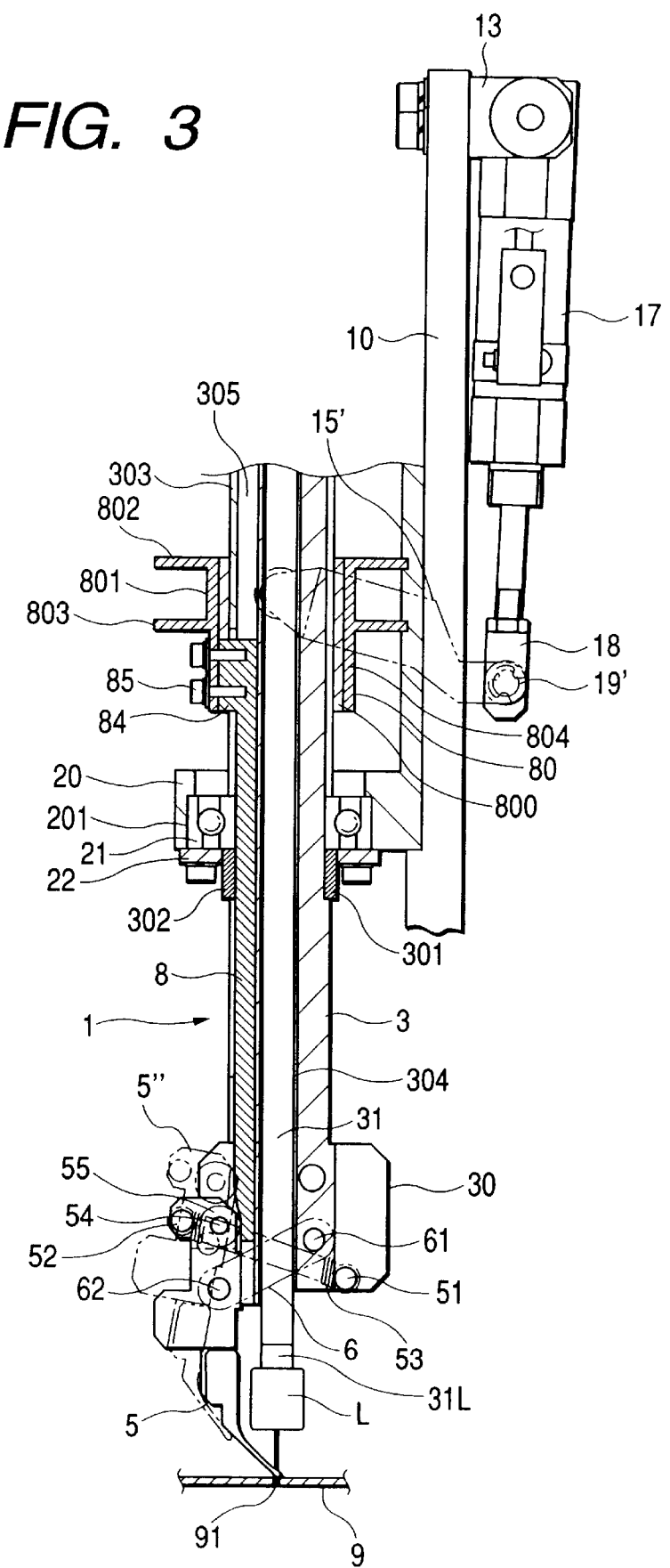
FIG. 3 is a cross-sectional view of the electronic parts insertion head at a time of inserting an electronic part L.

As shown in FIGS. 1 to 3, an upper slider 80 is mounted to the outer circumference of a cylinder 303 mounted above the ball bearing 21 of the main shaft 3 together with a cylindrical bush 800. The upper slider 80 is fitted and attached to a central hole of the cylindrical bush 800. The upper slider 80 is freely slid in the axial direction of the main shaft 3. An upper portion of the upper slider 80 has flanges 802 and 803 and a groove 801 between these flanges 802 and 803. A boss 804 having a circular outer shape extends below the flange 803. An outer circumference of the above roller 16 is fitted and engaged with the groove 801 of the upper slider 80. When the above lever 15 is swung with the shaft 14 as a pivot, the upper slider 80 is slid in the axial direction of the main shaft 3. Namely, when the piston rod of the air cylinder 17 goes in and out by supplying the air from the above pneumatic circuit, the lever 15 is swung with the shaft 14 being a pivot and the upper slider 80 is slid in the axial direction of the main shaft 3.

Figure 4:
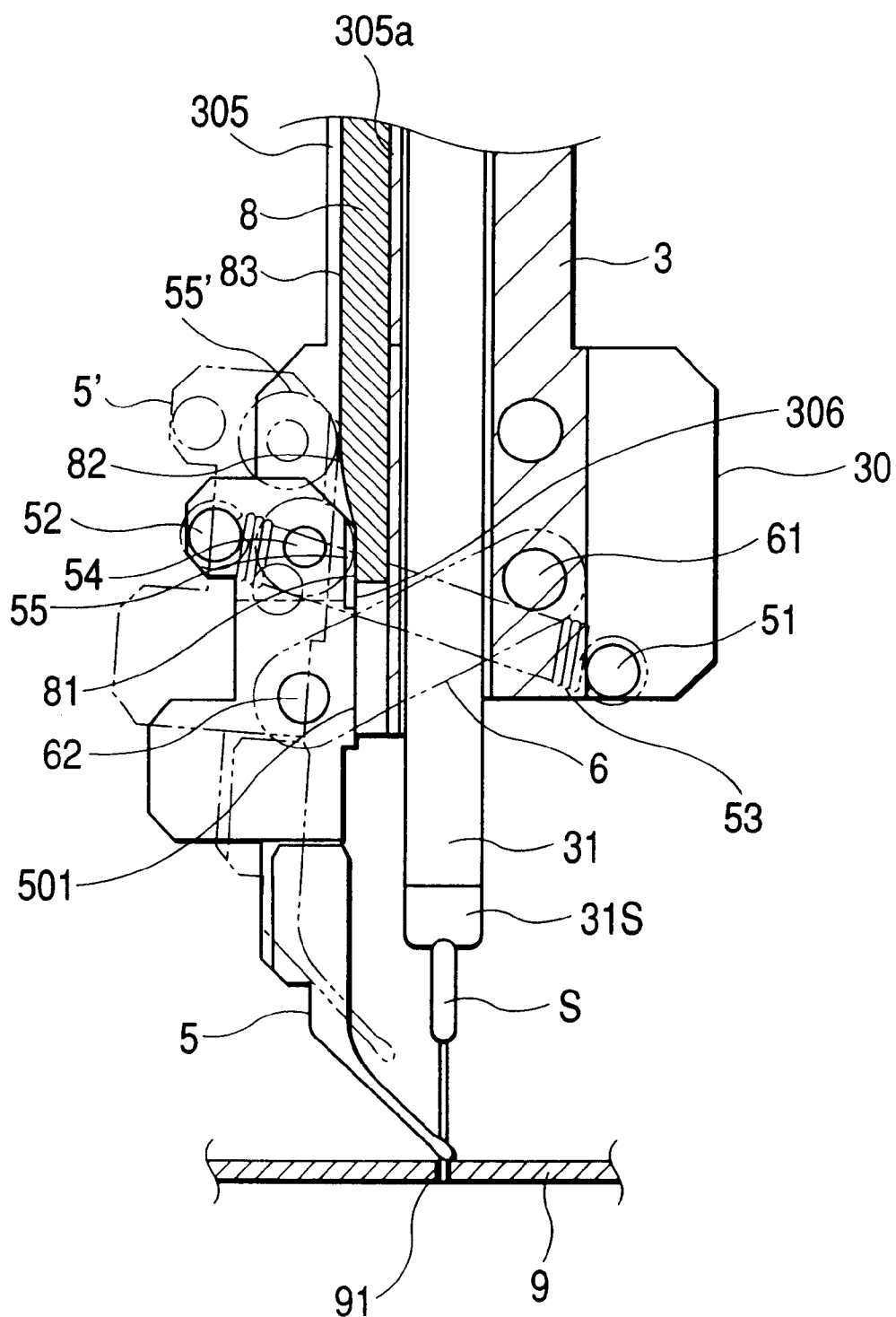
FIG. 4 is an enlarged view of the electronic parts insertion head at the time of inserting the electronic part S.

As shown in FIGS. 2 and 3, the main shaft 3 has a bore 304 extending through the main shaft 3 in the axial direction at its center. A pushing rod 31 is fitted and inserted into the bore 304 and an upper end of the pushing rod 31 is connected to a raising-lowering means arranged in the insertion device body. A cap 31S or 31L is detachably added to a lower end of the pushing rod 31. The cap 31S has a shape and a material suitable for the electronic part S having a thin thickness (a small diameter). The cap 31L has a shape and a material suitable for the electronic part L having a large diameter. For example, the cap 31S of FIG. 4 is formed in a shape suitable for a head portion of the electronic part S. The cap 31L of FIG. 5 has its lower end face flattened and corresponds to a state of a wide head portion of the electronic part L. An elongated groove 305 extending in the axial direction is formed in the outer circumference of the main shaft 3. The groove 305 extends in a slot shape in the axial direction of the main shaft 3 and a cam 8 is stored within the groove 305. The cam 8 is freely slid within the groove 305 in the axial direction of the main shaft 3. The cam 8 has a projecting portion 84 formed such that an upper end of the projecting portion 84 is projected from the outside diameter of the main shaft 3. The projecting portion 84 comes in contact with an inner circumferential portion of the boss 804 of the upper slider 80 and is fixedly attached to the boss 804 by a bolt 85. Accordingly, when the upper slider 80 is vertically slid with respect to the main shaft 3, the cam 8 is slid within the concave groove 305 in the axial direction.

Figure 5:
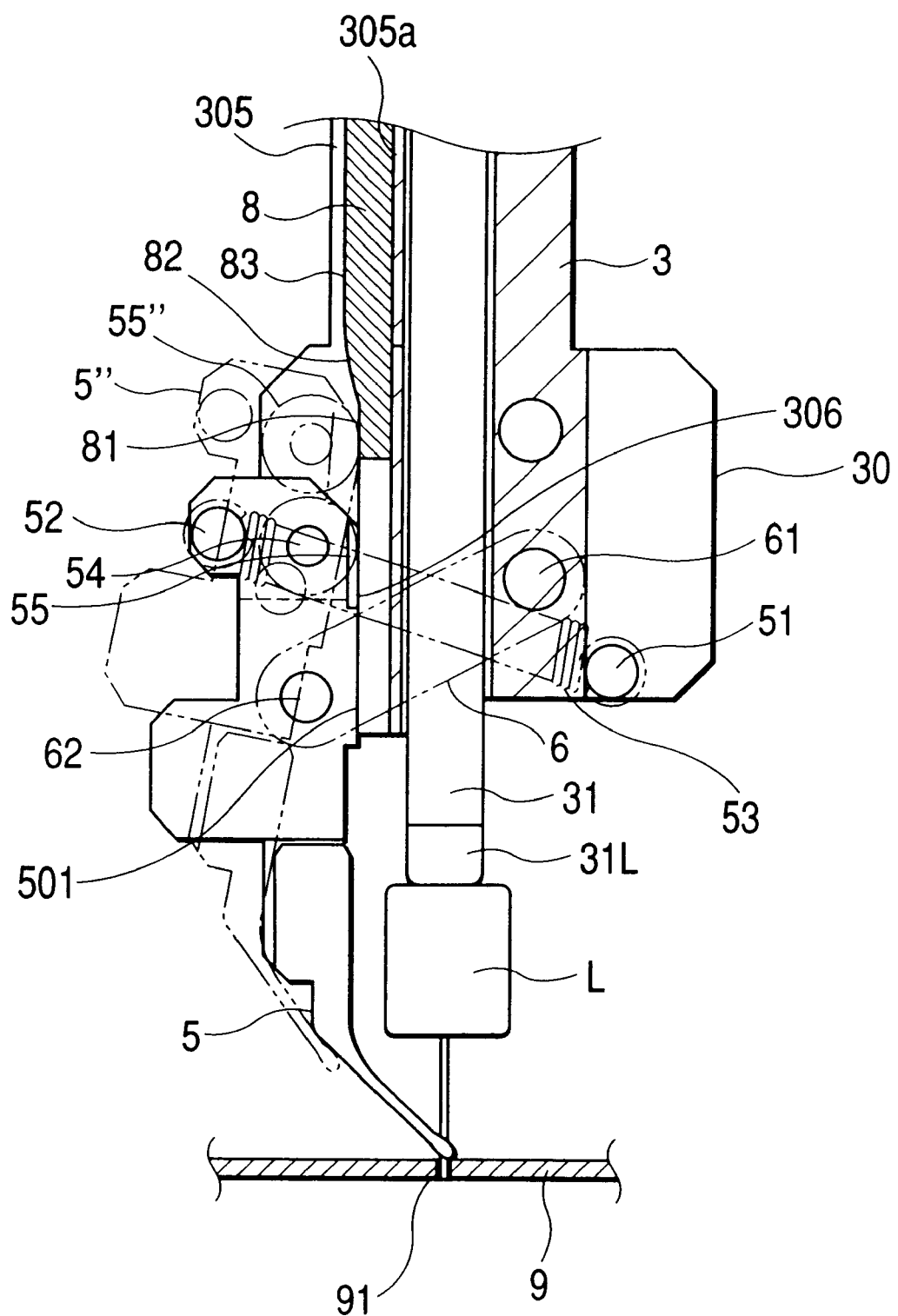
FIG. 5 is an enlarged view of the electronic parts insertion head at the time of inserting the electronic part L.

FIGS. 4 to 5 enlargedly show portions of the supporting block 30 and the insertion guide 5 at a lower end of the main shaft 3. The cam 8 is freely slid in contact with a bottom 305a of the groove 305. The insertion guide 5 is supported by the supporting block 30 through the first arm 6 and pivotal shafts 61, 62 shown by dashed lines. Further, a tension spring 53 stretched between pins 51, 52 constantly biases them in a direction approaching the pins 51, 52. A level difference portion 306 is formed at a lowermost end of the concave groove 305. A contact portion 501 of the insertion guide 5 biased by the tension spring 53 comes in contact with the level difference portion 306 and is positioned in a portion where the cam 8 does not exist (namely, a position lower than a lower end of the cam 8).

A cam face 81 with relatively lower height (the height measured from the bottom of the concave groove 305) is formed at the lower end of the cam 8. A curved cam surface 82 gradually rising from the cam face 81 and continuously connected to a high cam face 83 is subsequently formed. The cam face 81, the curved cam surface 82 and the cam face 83 are located in positions capable of supporting the roller 55 of the insertion guide 5. The cam 8 is seated on the bottom of the concave groove 305 and supports the roller 55 on its cam faces 81, 82, 83. The tension spring 53 constantly biases the insertion guide 5 in a state in which the contact portion 501 comes in contact with the level difference portion 306, or the roller 55 is supported by the cam face 81, the curved cam surface 82 or the cam face 83.

The above explanation was made with reference to arm, etc. for connecting the insertion guide 5 to the supporting block 30 each of which is arranged on a front face of the supporting block 30. However, a similar mechanism is also arranged on a rear side of the supporting block 30.

An operation of the electronic parts insertion device in the embodiment of the present invention will next be explained.

First, a movement of the insertion guide 5 will be described when the electronic part S having a thin thickness (a small diameter) are inserted into the printed wiring board 9. In this case, the piston rod of the air cylinder 17 is set to a most recessed (or innermost) state by control of the pneumatic circuit. The piston rod and the joint 18 are set to a state shown by a solid line in FIG. 1. The lever 15 is also set to a state shown by the solid line and the upper slider 80 is lowered to a position indicated by the solid line. FIG. 2 is a cross-sectional view showing a similar state and the lever 15 is shown by a dashed line. When the upper slider 80 is lowered, the cam 8 fixedly attached to the boss 804 is also located in a lowered position.

FIG. 4 enlargedly shows the insertion guide 5 shown in FIG. 2. The insertion guide 5 shown by a solid line in each of FIGS. 1, 2 and 4 is located in a most lowered position (a first position or a lowered position) with respect to the supporting block 30. In this position, the insertion guide guides a nipped lead wire of the electronic part S to an attaching hole of the printed wiring board 9. In this state, the contact portion 501 is in contact with the level difference portion 306. The insertion guide holds the lead wires of the electronic part S. These electronic part S are delivered from a chuck of the delivery head 111 (FIG. 8) when the insertion head 1 is raised from the printed wiring board 9 at an previous stage of the operation of a parts attaching device. The cap 31S of the pushing rod 31 is in contact with a head portion of the electronic part S. FIGS. 1, 2 and 4 show the state in which the insertion head 1 is lowered and a tip of the lead wire held by the insertion guide 5 is inserted into the attaching hole 91.

Subsequently, while the insertion head 1 is kept lowered, the insertion guide 5 is returned to a raised position (a second position) with respect to the supporting block 30. The pushing rod 31 is subsequently lowered and the cap 31S pushes the head portion of the electronic part S. When the lead wires of the electronic part S are inserted into the attaching holes 91 up to a predetermined position, the clinch head 151 of the clinch section 150 (FIG. 8) of the electronic parts insertion device bends and fixes the lead wire projected below a rear face of the printed wiring board 9. The piston rod of the air cylinder 17 is continuously set to the most recessed state in the returning operation of the insertion guide 5 to the raised position with respect to the supporting block 30 at this time. Accordingly, the cam 8 is also kept at the lowered position. In this state, when the pusher 90 arranged in the insertion device body is projected to the position illustrated with a dashed line 90', the pusher face 901 is projected to the position illustrated with a dashed line 901' and pushes the roller 45 up to the position illustrated with a dashed line 45'. When the lever 43 is swung to the position illustrated with a dashed line 43' against biasing of the tension spring 48 and the roller 44 is raised to the position illustrated with a dashed line 44', the lower slider 40 is raised up to the position illustrated with a dashed line 40'. The roller hook 41 fixedly attached to the lower slider 40 is also raised up to the position illustrated with a dashed line 41'. Thus, a roller 72 fitted to the concave groove 411 of the roller hook 41 is also raised up to the position illustrated with a dashed line 72' so that the second arm 7 is swung to the position illustrated with a dashed line 7' with the shaft 71 as a pivot.

When the second arm 7 is swung, a side 731 of a hole 73 formed in the second arm 7 and an outer circumference of the pin 52 are first in a position separated from each other. Therefore, the second arm 7 is independently swung without applying force to the pin 52 of the insertion guide, and relative positions of the insertion arm 7 and the insertion guide 5 are changed. This change in relative position corresponds to a change from a state shown in FIG. 7B to a state shown in FIG. 7A so that the insertion guide 5 releases the holding of the lead wire of the electronic part S. When the second arm 7 is further continuously swung and the side 731 of the hole 73 comes in contact with the pin 52, the second arm 7 pushes the pin 52 against biasing of the tension spring 53.

When the pusher 90 is advanced to the position illustrated with a dashed line 90' by the above processes, the insertion guide 5 is raised up to the position illustrated with a dashed line 5'.

When the insertion guide 5 is raised up to the position illustrated with the dashed line 5' in FIGS. 2 and 4, the roller 55 is raised up to the position illustrated with a dashed line 55'. During the above process, the cam 8 is kept in its lowered position. The rising roller 55 is moved from the cam face 81 to the cam face 83 through the cam curved surface 82 while the roller 55 is continuously in contact with the cam 8 in that position. In this state, while the pushing rod 31 is subsequently lowered and the cap 31S pushes the head portion of the electronic part S and inserts the lead wires, the pusher 90 is advanced so that the insertion guide is raised.

In the above processes, the locus of the movement of the insertion guide 5 is determined by the movement of the roller 55 (and constraint or restriction due to the first arm 6) that follows the cam faces 81, 82 and 83. That is a locus starting from a state (a first position or a lowering position) shown by a solid line 5 in FIGS. 2 and 4 and ending at a state (a second position or a rising position) shown by a dashed line 5'. This movement locus results in a locus with small escape or runout (namely, small in movement in a direction parallel to the printed wiring board) corresponding to the electronic part S having a thin thickness (a small diameter). Therefore, since a space required for retreating the insertion guide is reduced, the electronic part S having a thin thickness (a small diameter) can be mounted at high density on the printed wiring board 9.

After the insertion of the electronic part S into the printed wiring board is completed by the above operation, the entire insertion head 1 is pulled upward while the pushing rod 31 is raised. When the insertion head 1 is stopped in an uppermost position, the delivery head 111 conveys an electronic part to be next inserted. Then, the pusher 90 of the insertion head 1 is retreated so that the insertion guide is lowered. The insertion guide receives lead wires of the electronic part from the delivery head 111 in its lowermost position 5 with respect to a body of the insertion head 1, and nips the lead wires. Thereafter, the delivery head opens its chuck and releases the electronic part. When the delivery head is separated from the insertion head, the insertion head 1 is lowered and returned to a state shown in FIG. 1 and the next part insertion cycle is started.

When a plurality of electronic parts S having a thin thickness (a small diameter) are continuously mounted to the printed wiring board 9, the cam 8 may be continuously maintained in the lowered position. Namely, it is not necessary to perform a switching operation for making the piston rod of the air cylinder 17 go in and out.

A movement of the insertion guide 5 will subsequently be explained when the electronic part L of a large diameter are inserted into the printed wiring board 9. In this case, the piston rod of the air cylinder 17 is set to a most projected (or outermost) state by control of the pneumatic circuit. At this time, the shaft 19 connected to the joint 18 is located in a position shown by a dashed line 19' in FIG. 1. The lever 15 is set to a state shown by a dashed line 15'. The upper slider 80 is raised to the position of a dashed line 80'. FIG. 3 is a cross-sectional view showing a similar state. The dashed line 15' shows a position of the lever 15. When the upper slider 80 is raised, the cam 8 fixedly attached to the boss 804 is also located in a raised position.

FIG. 5 enlargedly shows the insertion guide 5 shown in FIG. 3. The insertion guide 5 shown by a solid line in each of FIGS. 3 and 5 is located in a lowermost position (a first position or a lowered position) with respect to the supporting block 30. In this position, the insertion guide guides the nipped lead wire of the electronic part S to an attaching hole of the printed wiring board 9. In this state, the contact portion 501 is in contact with the level difference portion 306. Further, the insertion guide holds the lead wire of the electronic part L. These electronic part L are delivered from the chuck of the delivery head 111 when the insertion head 1 is raised from the printed wiring board 9 at a previous stage of the operation of the parts attaching device. The cap 31L of the pushing rod 31 is in contact with the head portion of the electronic part L. FIGS. 3 and 5 show a state in which the insertion head 1 is lowered and a tip of the lead wire held by the insertion guide 5 is inserted into the attaching hole 91.

Subsequently, the insertion guide 5 is returned to the raised position (the second position) with respect to the supporting block 30 while the insertion head 1 is kept lowered. The pushing rod 31 is subsequently lowered and the cap 31L pushes the head portion of the electronic part L. When the lead wires of the electronic part L are inserted into the attaching holes 91 up to a predetermined position, the clinch head 151 of the clinch section 150 of the electronic parts insertion device bends and fixes the lead wire projected below a rear face of the printed wiring board 9. The piston rod of the air cylinder 17 is continuously set to the most projecting state in the returning operation of the insertion guide 5 to the raised position with respect to the supporting block 30 at this time. Accordingly, the cam 8 is also kept in the raised position. In this state, when the pusher 90 arranged in the insertion device body is projected to the position illustrated with a dashed line 90', the pusher face 901 is projected to the position illustrated with a dashed line 901' and pushes the roller 45 up to the position illustrated with a dashed line 45'. The lever 43 is swung to the position illustrated with a dashed line 43' against biasing of the tension spring 48. When the roller 44 is raised to the position illustrated with a dashed line 44', the lower slider 40 is raised up to the position illustrated with a dashed line 40'. The roller hook 41 fixedly attached to the lower slider 40 is also raised up to the position illustrated with a dashed line 41'. Thus, the roller 72 fitted to the concave groove 411 of the roller hook 41 is also raised up to the position illustrated with a dashed line 72' so that the second arm 7 is swung to the position illustrated with a dashed line 7' with the shaft 71 as a pivot.

When the second arm 7 is swung, the side 731 of the hole 73 formed in the second arm 7 and an outer circumference of the pin 52 are first in a position separated from each other. Therefore, the second arm 7 is independently swung without applying force to the pin of the insertion guide, and relative positions of the second arm 7 and the insertion guide 5 are changed. This change in relative position corresponds to a change from a state shown in FIG. 7B to a state shown in FIG. 7A. Thus, the insertion guide 5 releases the holding of the lead wire of the electronic part L. When the second arm 7 is further continuously swung and the side 731 comes in contact with the pin 52, the second arm 7 pushes the pin 52 against biasing of the tension spring 53.

The insertion guide 5 is raised up to the position illustrated with a dashed line 5' by the above processes when the pusher 90 is advanced to the position illustrated with a dashed line 90'.

In FIGS. 3 and 5, the roller 55 is raised up to the position illustrated with a dashed line 55" when the insertion guide 5 is raised up to the position illustrated with a dashed line 5". During the above process, the cam 8 is kept in its raised position. The rising roller 55 is moved while the rising roller 55 first comes in contact with the contact portion 501 and then comes in contact with the cam face 81. In this state, while the pushing rod 31 is subsequently lowered and the cap 31L pushes the head portion of the electronic part L and inserts the lead wire, the pusher 90 is advanced so that the insertion guide 5 is raised.

In the above processes, the locus of the movement of the insertion guide 5 is determined by the contact portion 501 and the movement of the roller 55 (and constraint due to the first arm 6) that follows the cam face 81. The locus of a lower end of the insertion guide 5 is a locus starting from a state (a first position or a lowering position) shown by a solid line 5 in FIGS. 3 and 4 and ending at a state (a second position or a rising position) shown by a dashed line 5". This locus results in a locus with large escape or runout (namely, large in movement in a direction parallel to the printed wiring board) corresponding to the electronic part L of a large diameter. Therefore, for the electronic part L of a large diameter, the insertion guide 5 and the electronic part L do not interfere with each other at a returning operation time of the insertion guide 5. Accordingly, the insertion into the printed wiring board 9 can be executed by using the same insertion guide 5 as the insertion guide for the electronic parts of a small diameter.

After the insertion of the electronic part S into the printed wiring board is completed by the above operation, the entire insertion head 1 is pulled upward while the pushing rod 31 is raised. When the insertion head 1 is stopped in an uppermost position, the delivery head 111 conveys an electronic part to be next inserted. Then, the pusher 90 of the insertion head 1 is retreated, so that the insertion guide is lowered. The insertion guide receives and nips lead wires of the electronic part from the delivery head 111 in its lowermost position 5 with respect to a body of the insertion head 1. Thereafter, the delivery head opens its chuck and releases the electronic part. When the delivery head is separated from the insertion head, the insertion head 1 is lowered and returned to a state shown in FIG. 1 and the next part insertion cycle is started.

When a plurality of electronic parts L of a large diameter are continuously mounted to the printed wiring board 9, the cam 8 may be continuously maintained in the raised position. Namely, it is not necessary to perform a switching operation for making the piston rod of the air cylinder 17 go in and out.

The insertion head 1 is located in its uppermost raised position when the insertion guide 5 receives the electronic part S or L from the chuck of the delivery head 111. The insertion guide must be located in a predetermined position constantly to receive the electronic parts from the delivery head 111 in this state. In the device explained above, the position of the insertion guide for receiving the electronic parts from the delivery head can be set to the same position (namely, a position drawn by a solid line designated by reference numeral 5 in FIGS. 1 to 5 with respect to the insertion head body) irrespective of the position of the cam 8, i.e., irrespective of whether a locus of the insertion guide is set to a locus with small escape corresponding to the electronic part S of a small diameter, or a locus large in escape corresponding to the electronic part L of a large diameter. Accordingly, when the electronic parts of the same size (electronic part S or L) are continuously attached, no switching operation of the movement locus is required and it is not necessary to perform an operation for switching the position of the cam 8 by making the piston rod of the air cylinder 17 go in and out during the operating cycle of an attaching head.

In the above embodiment, the locus of the insertion guide is switched between two kinds by switching the position of the cam 8 between two positions, that is uppermost and lowermost positions. However, the locus can be also set to three kinds or more by switching the cam position in three positions or more.

In the above embodiment, the cam face coming in contact with the roller 55 as a cam follower changes during rise of the insertion guide by changing the position of the same cam so that the rising locus of the insertion guide is changed. However, the cam face coming in contact with the cam follower can be also changed by using plural cams and switching these cams.

Here, the correspondence of elements of the present invention described in the SUMMARY OF THE INVENTION and components in the embodiment explained above will next be explained.

A mechanism including the pusher 90, the lever 43, the lower slider 40, the roller 72 and the second arm 7 is a mechanism for moving the insertion guide between the first position (lowered position) and the second position (raised position). This mechanism constitutes a insertion guide moving mechanism.

The pushing rod 31 pushing a top portion of the electronic part S or L downward and pushing the lead wire of the electronic parts into the attaching hole of the printed wiring board constitutes an electronic parts pressing means.

A mechanism including the air cylinder 17, the lever 15 and the upper slider 80 is a mechanism for changing the position of the cam 8 within the main shaft 3. This mechanism constitutes a cam position changing mechanism.

The roller 55 arranged on the insertion guide 5 comes in contact with the cam faces 81, 82, 83 of the cam 8 at a rising time of the insertion guide, and is moved along cam shapes of these cam faces. This roller 55 corresponds to a cam follower. In this embodiment, this member is set to a rotatable following portion of a roller type to perform a smooth moving operation. However, this member in the present invention is not limited to the rotatable following portion, but may be also set to a cam follower of a fixing type instead of the roller.

Further, the tension spring 53 tensioned between the pin 51 arranged in the supporting block 30 and the pin 52 attached to the insertion guide is biasing the pins 51 and 52 in an approaching direction of both the pins. Thus, the roller 55 as a cam follower is maintained such that the roller 55 comes in contact with the cam 8 in a biased state. A mechanism or a member including these elements constitutes a biasing means. This biasing means is not limited to the tension spring as in the embodiment, but other elastic or non-elastic members may also be used as far as they keep the cam follower in contact with the cam in the biased state.

In any case, the embodiment explained here shows merely an example of the present invention and the present invention is not limited to detailed portions of this embodiment.

What is claimed is:

1. An electronic parts insertion head comprising:
    a supporting block;
    an insertion guide movable between first and second positions with respect to said supporting block and configured to guide a lead wire of an electronic part to an attaching hole of printed wiring board in said first position;
    an insertion guide moving mechanism configured to move said insertion guide between said first and second positions;
    a cam capable of moving with respect to said supporting block;
    a cam follower arranged on said insertion guide and positioned to move along a cam face of said cam; and
    a cam position changing mechanism configured to change a position of said cam with respect to said support block;
    wherein said insertion guide changes a movement locus when the position of said cam is changed by said cam position changing mechanism.

2. The electronic parts insertion head according to claim 1, wherein:
    said insertion guide is connected to the supporting block by an arm having one end pivotally supported by said supporting block and the other end pivotally supported by the insertion guide;
    the insertion head further comprises a biasing member for biasing said insertion guide such that the cam follower is in contact with said cam face; and
    said movement locus of the insertion guide is determined by constraint due to the arm and the contact between said cam follower and said cam face.

3. The electronic parts insertion head according to claim 1, wherein the position of said cam is changed by said cam position changing mechanism with pneumatic pressure as a driving source.

4. An electronic parts insertion head comprising:
    a supporting block;
    a first arm having one end pivotally supported by the supporting block;
    a second arm having one end pivotally supported by said supporting block;
    an insertion guide pivotally mounted to the other end of said first arm;
    a first pivotal shaft fitted to a hole formed in said second arm and a hole formed in said insertion guide;
    a second pivotal shaft fitted to said supporting block;
    a biasing member for biasing said first and second pivotal shafts in an approaching direction;
    a roller rotatably attached to a shaft fixedly attached to an upper portion of said insertion guide;
    cam positioned in contact with said roller; and
    a cam position changing mechanism configured to change a position of said cam with respect to said supporting block;
    wherein:
        said roller is moved in contact with said cam in a state biased by said biasing member when said insertion guide is rising; and
        the insertion guide changes a locus by changing the position of said cam.

5. An electronic parts insertion device comprising:
    a parts supplying mechanism configured to supply an electronic part having a lead wire;
    an electronic parts insertion head configured to receive the electronic part from said parts supplying mechanism and insert the lead wire of the electronic part into an attaching hole of a printed wiring board; and
    a clinch mechanism configured to cut, bend and fix the lead wire of the electronic part inserted into the printed wiring board;
    wherein:
        said electronic parts insertion head includes a supporting block, an insertion guide movable between first and second positions with respect to said supporting block and configured to guide the lead wire of the electronic part to the attaching hole of the printed wiring board in said first position, an insertion guide moving mechanism configured to move said insertion guide between said first and second positions, a cam capable of moving with respect to said supporting block, a cam follower arranged on said insertion guide and configured to move along a cam face of said cam, and cam position changing means for changing the position of said cam; and
        said electronic parts insertion head changes a movement locus of said insertion guide by changing the position of said cam.

6. The electronic parts insertion device according to claim 5, wherein:

said insertion guide is connected to the supporting block by an arm having one end pivotally supported by said supporting block and the other end pivotally supported by the insertion guide;

the insertion head further comprises a biasing member for biasing said insertion guide such that the cam follower is in contact with said cam face; and said movement locus of the insertion guide is determined by constraint due to the arm and by the contact between said cam follower and said cam face.

7. The electronic parts insertion device according to claim 5, wherein the position of said cam is changed by said cam position changing means with pneumatic pressure as a driving source.

8. The electronic parts insertion device comprising:

a parts supplying mechanism configured to supply an electronic part having a lead wire;

an electronic parts insertion head configured to receive the electronic part from said parts supplying mechanism and insert the lead wire of the electronic part into an attaching hole of a printed wiring board; and a clinch mechanism configured to cut, bend and fix the lead wire of the electronic part inserted into the printed wiring board;

wherein:

said electronic parts insertion head includes a supporting block, a first arm having one end pivotally supported by the supporting block, a second arm having one end pivotally supported by said supporting block, an insertion guide pivotally mounted to the other end of said first arm, a first pivotal shaft fitted to a hole formed in said second arm and a hole formed in said insertion guide, a second pivotal shaft fitted to said supporting block, a biasing member for biasing said first and second pivotal shafts in an approaching direction, a roller rotatably attached to a shaft fixedly attached to an upper portion of said insertion guide, a cam positioned in contact with said roller, and cam position changing means for changing a position of said cam with respect to said supporting block;

said roller is moved in contact with said cam in a state biased by said biasing member when said insertion guide is rising; and the insertion guide changes a locus by changing the position of said cam.

9. The electronic parts insertion head comprising:

a supporting block;

an insertion guide movable between first and second positions with respect to said supporting block and configured to guide a lead wire of an electronic part to an attaching hole of a printed wiring board in said first position;

an insertion guide moving mechanism configured to move said insertion guide between said first and second positions; and a cam mechanism having a cam and a cam follower arranged on said insertion guide and adapted to move along a cam face of said cam;

wherein said cam mechanism changes the cam face in contact with said cam follower when said insertion guide is moving so that said insertion guide changes a movement locus.

10. The electronic parts insertion head according to claim 9, wherein a shape of the cam face coming in contact with the cam follower of said cam mechanism is changed by changing a position of the cam.

* * * * *

UNITED STATES PATENT AND TRADEMARK OFFICE
CERTIFICATE OF CORRECTION

PATENT NO. : 6,336,266 B1
DATED : January 8, 2002
INVENTOR(S) : Kobayashi et al.

It is certified that error appears in the above-identified patent and that said Letters Patent is hereby corrected as shown below:

<u>Title page,</u>
Item [30], Foreign Application Priority information should read:
-- [30]                  Foreign Application Priority Data

Mar. 17, 1999    (JP)............................................11-071910
         Feb. 24, 2000    (JP)...........................................2000-047147 --.

Signed and Sealed this

Tenth Day of September, 2002

Attest:

Attesting Officer

JAMES E. ROGAN
*Director of the United States Patent and Trademark Office*